United States Patent [19]

Kondo

[11] Patent Number: 5,180,096

[45] Date of Patent: Jan. 19, 1993

[54] METHOD AND APPARATUS FOR REFLOW-SOLDERING OF PRINTED CIRCUIT BOARDS

[75] Inventor: Kenshi Kondo, Tokyo, Japan

[73] Assignee: Nihon Den-Netsu Keiki Co., Ltd., Tokyo, Japan

[21] Appl. No.: 735,352

[22] Filed: Jul. 24, 1991

[30] Foreign Application Priority Data

Jul. 25, 1990 [JP] Japan .................. 2-194772
Feb. 26, 1991 [JP] Japan .................. 3-53132
Feb. 26, 1991 [JP] Japan .................. 3-53133

[51] Int. Cl.$^5$ .................. B23K 1/19; B23K 31/02
[52] U.S. Cl. .................. 228/180.1; 228/6.2; 228/232; 392/408; 392/416; 392/417
[58] Field of Search .................. 228/180.1, 180.2, 227, 228/6.2, 232, 187; 392/408, 416, 417

[56] References Cited

U.S. PATENT DOCUMENTS

| 4,554,437 | 11/1985 | Wagner et al. | 392/416 |
| 4,761,881 | 8/1988 | Bora et al. | 228/180.1 |
| 4,771,929 | 9/1988 | Bahr et al. | 228/180.2 |
| 4,938,410 | 7/1990 | Kondo | 228/180.1 |

FOREIGN PATENT DOCUMENTS

| 61-289967 | 12/1986 | Japan | 392/416 |
| 1-27773 | 1/1989 | Japan | 392/408 |

Primary Examiner—Richard K. Seidel
Assistant Examiner—Jeffrey T. Knapp
Attorney, Agent, or Firm—Stephen F. K. Yee

[57] ABSTRACT

A method and apparatus for reflow-soldering of printed circuit boards are disclosed. A printed circuit board having electronic parts with lead wires having low temperature resistance alone or together with electronic part of high temperature resistance can be soldered according to the reflow-soldering method in a specifically designed heating zone involving plural preheating chambers and a reflowing chamber while maintaining a difference in temperature between the obverse surface and the reverse surface of the board without causing any soldering failure and any environmental pollution.

5 Claims, 14 Drawing Sheets

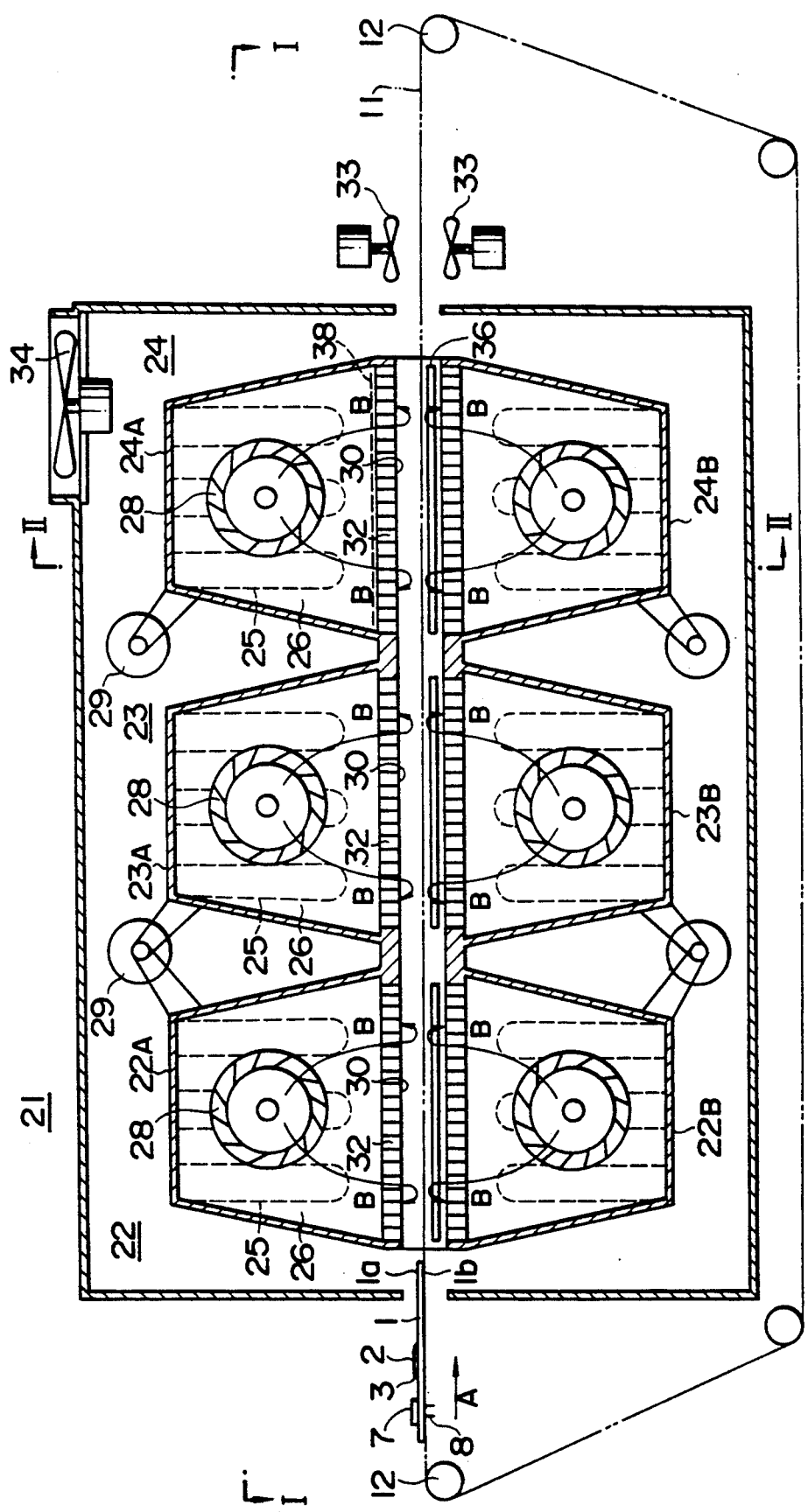

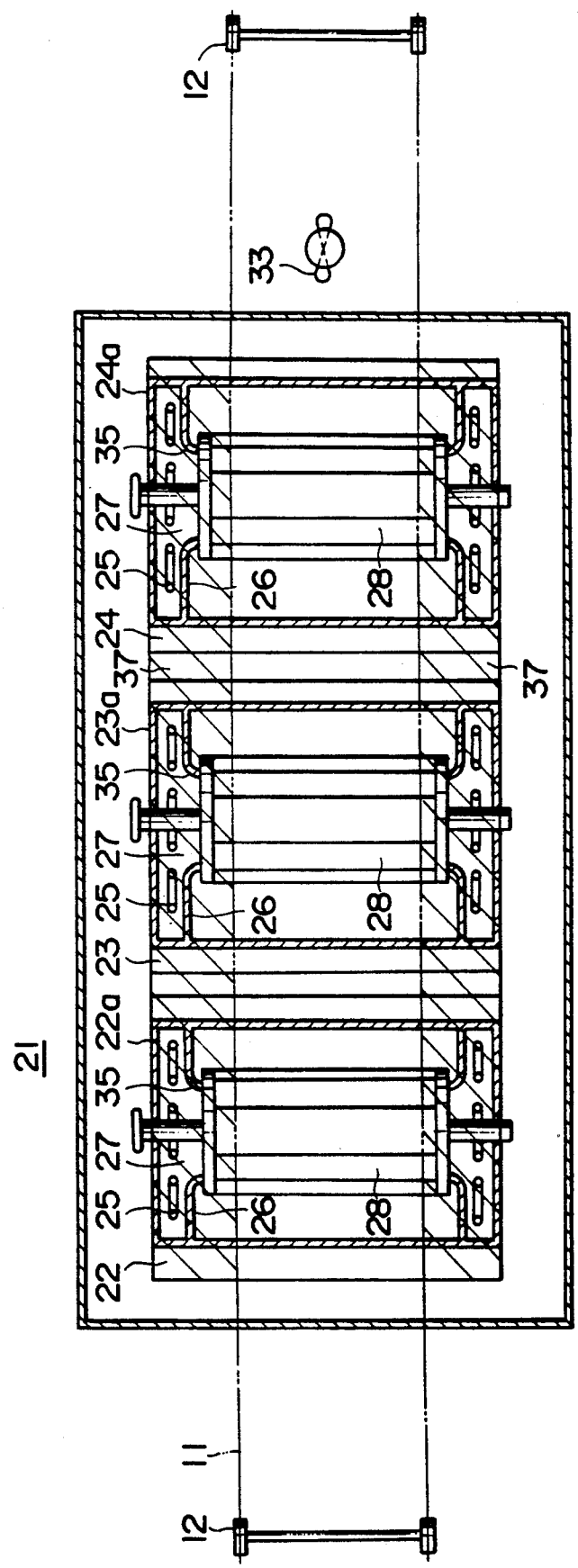

FIG. l(c)
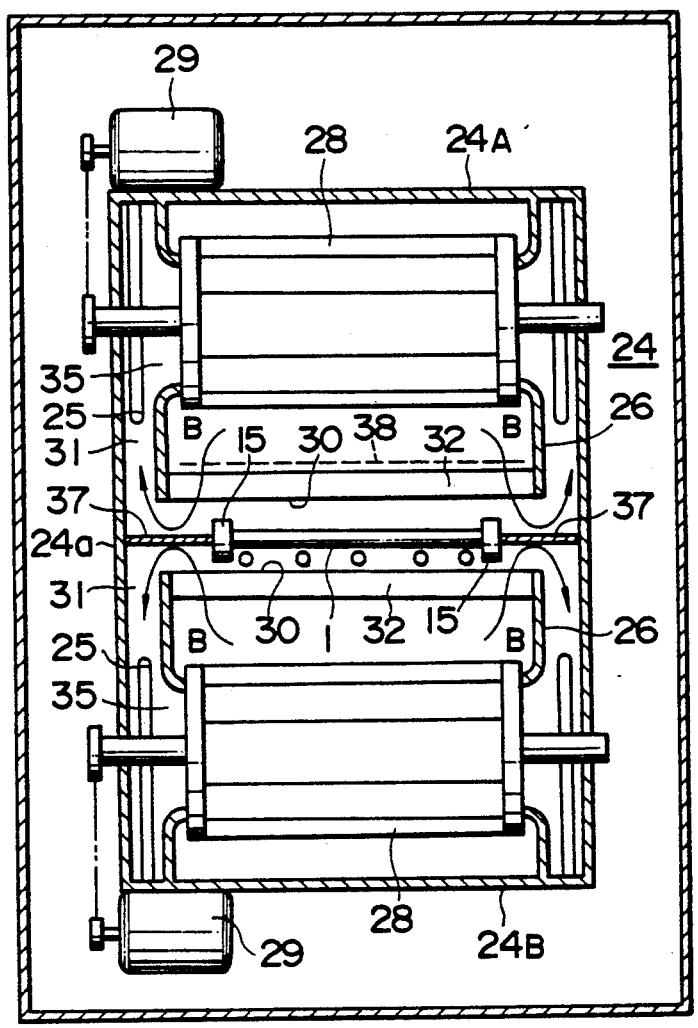
FIG. l(d)
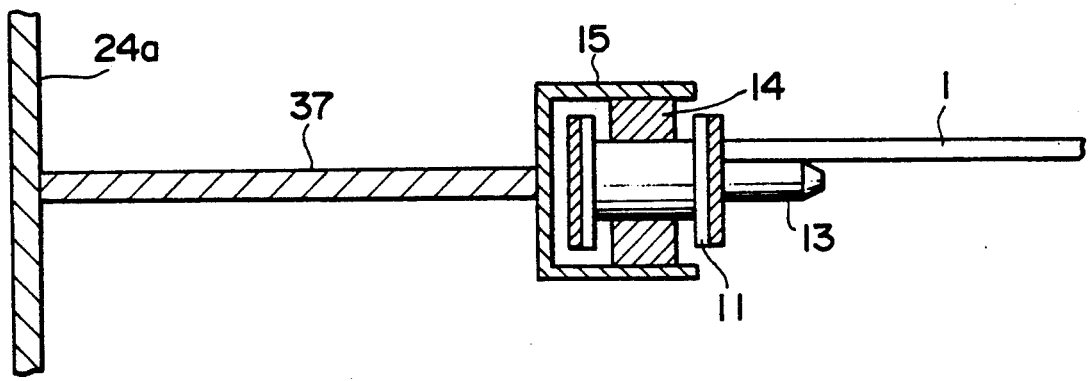

F I G. 2(a)
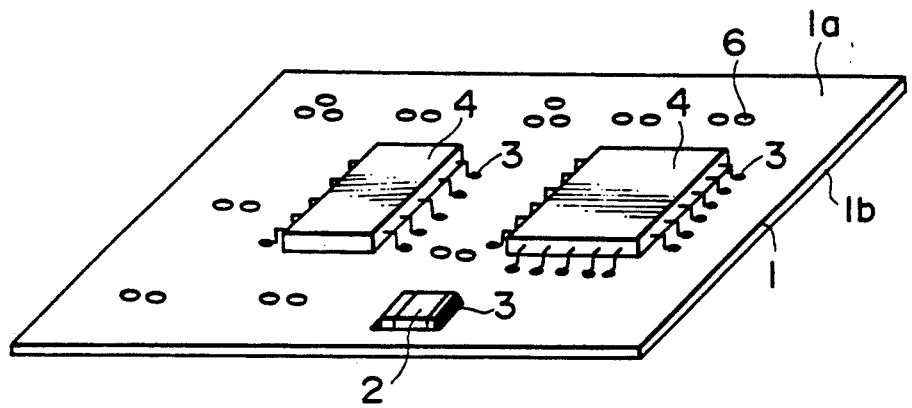
F I G. 2(b)
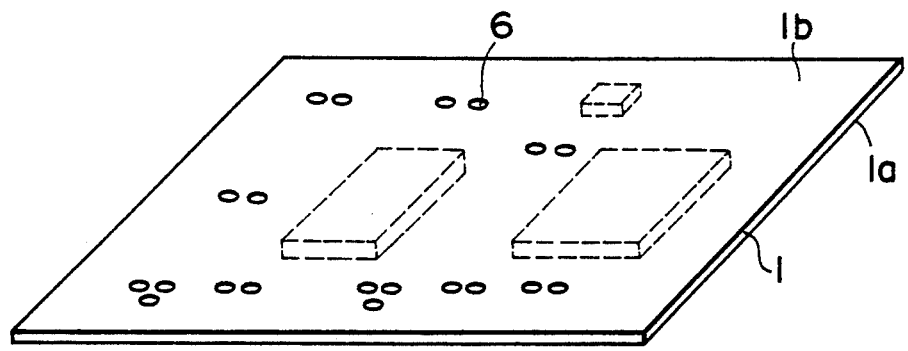
F I G. 2(c)
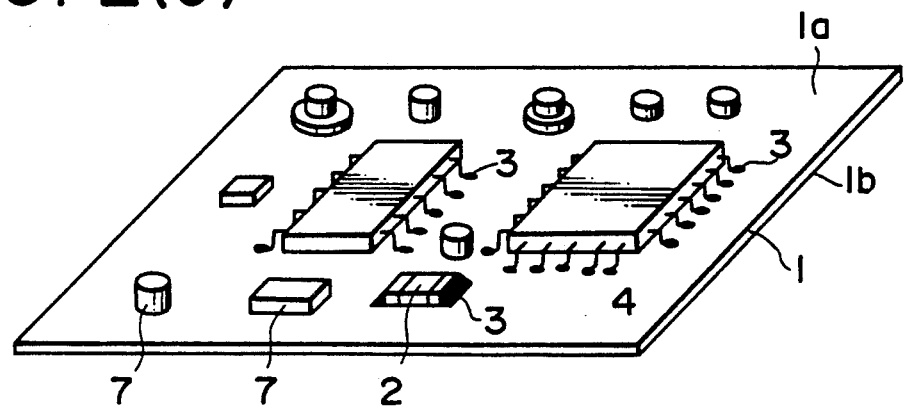

F I G. 5(a)
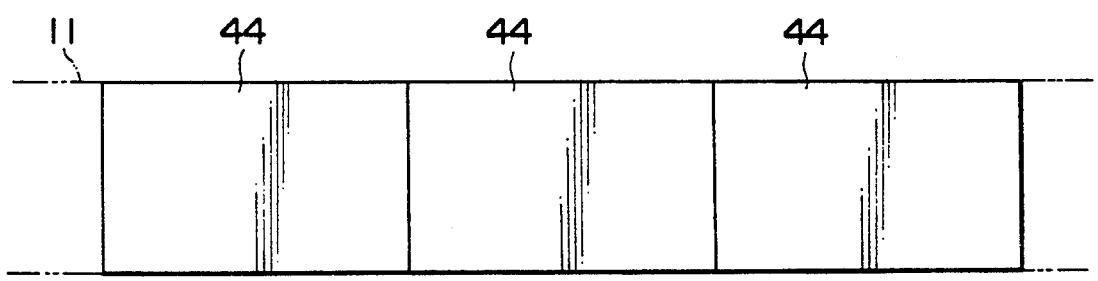
F I G. 5(b)
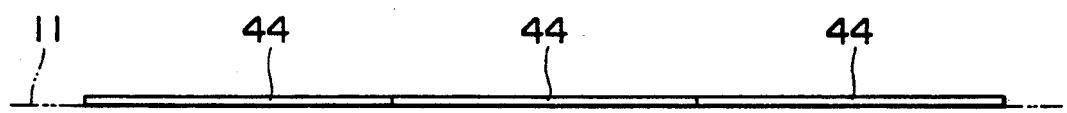

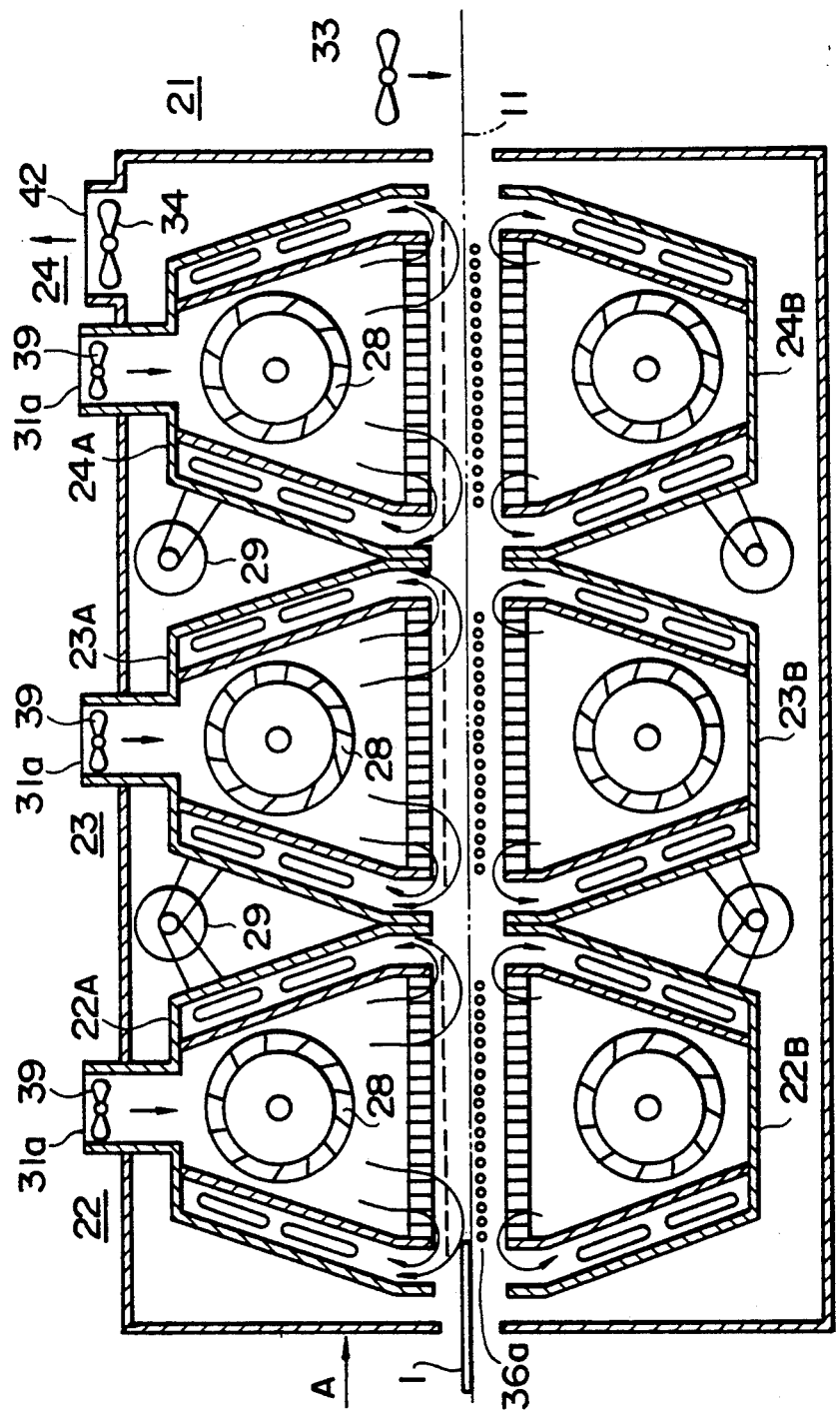

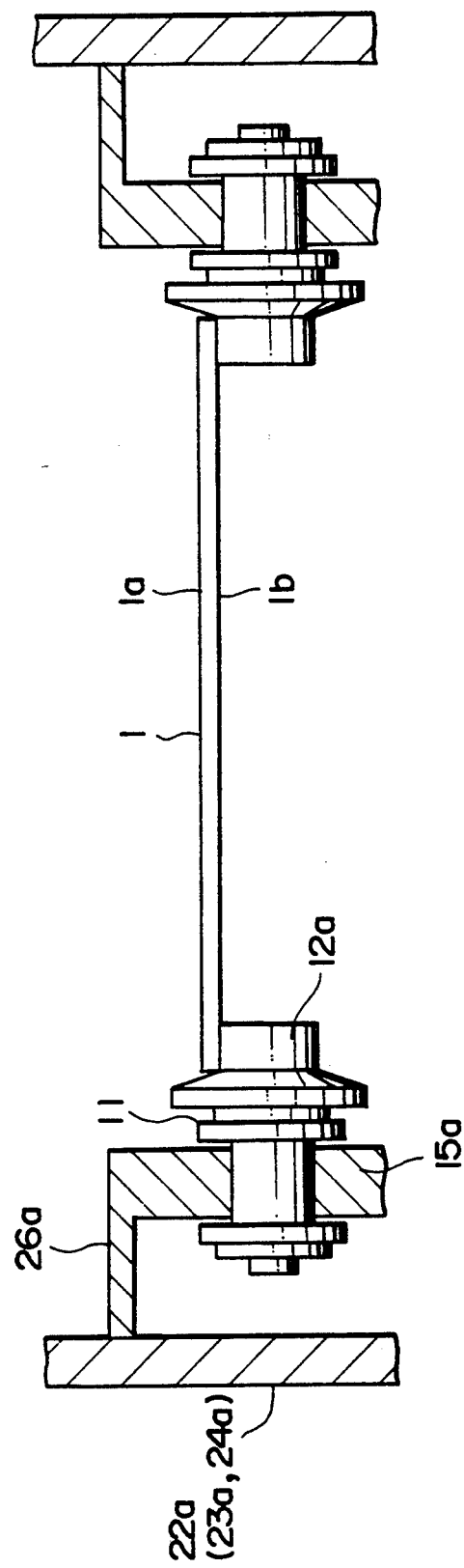

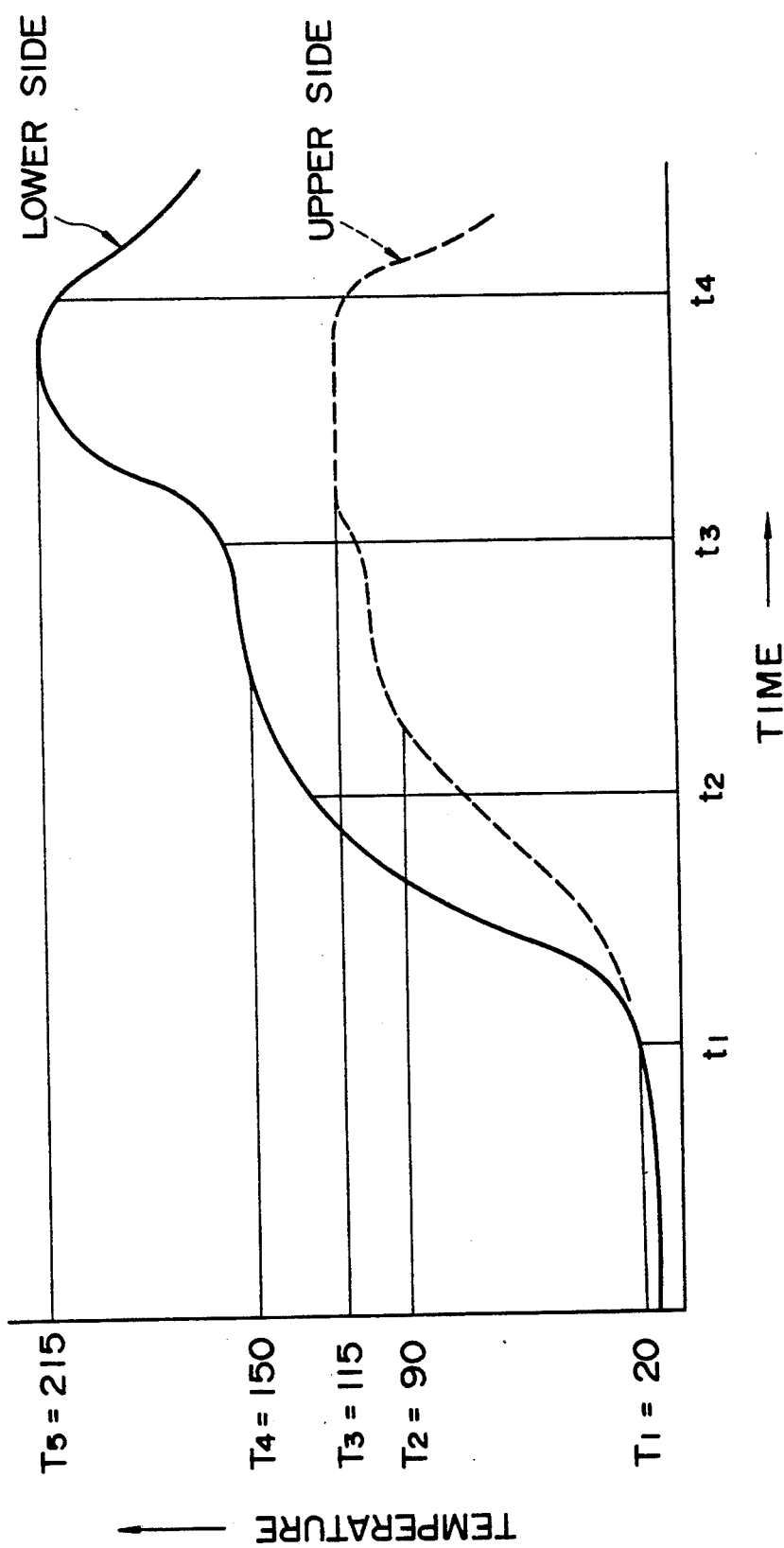

METHOD AND APPARATUS FOR REFLOW-SOLDERING OF PRINTED CIRCUIT BOARDS

BACKGROUND OF THE INVENTION

1. Field of the Invention

The present invention relates to a method and apparatus for soldering printed circuit boards under reflowing of solder preforms or solder pastes applied onto the boards in a heating zone (this mode of soldering will be referred to hereinafter as "reflow-soldering"). More particularly, the present invention relates to a method and apparatus for reflow-soldering printed circuit boards carrying electronic parts with lead wires of relatively low temperature resistance alone or together with electronic parts of relatively high temperature resistance such as chip parts and flat packages (referred to hereinafter sometimes simply as SMD) in a specific manner and a specifically designed heating zone without causing any soldering failure and any environmental pollution.

2. Description of the Prior Art

From the past, a soldering operation of printed circuit boards having mounted thereon SMD of relatively high temperature resistance was carried out in a reflow-soldering apparatus where the soldering operation is made in a high temperature atmosphere maintained at a temperature of 210°-250° C. In case of printed circuit boards having mounted thereon SMD of relatively high temperature resistance together with electronic parts with lead wires having a relatively low temperature resistance, the soldering operation was carried out by mounting SMD to a printed circuit board to which a solder paste had been applied, subjecting the board to soldering in a reflow-soldering apparatus, mounting the electronic parts with lead wires to the board, soldering the board in a jet-type soldering tank or a flow-dip type soldering tank after painting a flux to the board and subjecting it to a preliminary heating treatment, and washing the board with freon (marketed from DuPont) or the like solvent.

In accordance with the recent versatility in surface-mounting technique and in accordance with the reduction in cost of printed circuit boards, electronic parts with lead wires have been soldered heretofore in a flow-dip type soldering tank or in a jet-type soldering tank. Among these electronic parts, however, those of poor temperature resistance as low as 120° C. have not yet been soldered in a reflow-soldering apparatus. In the currently used reflow-soldering apparatus, the temperature of the heating zone is uniformly maintained at about 210°-150° C. Accordingly, there is raised a problem such that a reflow-soldering apparatus is unsuited for soldering electronic parts with lead wires which are poor in temperature resistance as low as about 120° C.

In order to solder electronic parts with lead wires in a jet-type soldering tank or a flow-dip type soldering tank, additional devices such as a flux-coating device, a preliminary heating device and a washing device become necessary. Among these additional devices, the washing device wherein freon is used as a washing solvent may cause a serious problem; when the vapor of freon leaks out of the device, such wasteful consumption of the solvent not only increases the cost of the products but also causes bad working environment and even pollution. Thus, exclusion of the use of freon is highly desired for soldering electronic parts with lead wires. Further, the use of a reflow-soldering apparatus is also desired for soldering to printed circuit boards both electronic parts having a high temperature resistance and electronic parts having a low temperature resistance.

Under the above mentioned circumstances, there is a great demand for developing a new method and apparatus for carrying out soldering of electronic parts with lead wires having a poor temperature resistance by means of reflow-soldering not accompanying any washing step with freon.

BRIEF SUMMARY OF THE INVENTION

Accordingly, it is an object of the present invention to provide a method for reflow-soldering printed circuit boards carrying electronic parts with lead wires of relatively low temperature resistance in a specifically designed heating zone.

It is another object of the present invention to provide a method for reflow-soldering printed circuit boards carrying electronic parts with lead wires of relatively low temperature resistance together with electronic parts of relatively high temperature resistance without effecting any washing treatment with freon.

It is still another object of the present invention to provide an apparatus for reflow-soldering printed circuit boards carrying electronic parts with lead wires of poor temperature resistance alone or together with electronic parts of high temperature resistance wherein a specifically designed heating zone is provided for soldering these electronic parts to make differences in temperature between the obverse surface and the reverse surface of the circuit boards passing through the heating zone.

Other and further objects, features and advantages of the present invention will become apparent from the following description.

As a result of extensive research made for developing a new method and apparatus for reflow-soldering to printed circuit boards electronic parts with lead wires of poor temperature resistance alone or together with SMD of high temperature resistance, it has now been found that such reflow-soldering can be attained by turning upside down the printed circuit boards the obverse surface of which optionally has SMD mounted thereon, applying solder pastes to penetrated apertures provided on the reverse side of the boards through which the lead wires of the electronic parts are to be inserted, turning the boards downside up, mounting the electronic parts onto the obverse surface of the boards with the lead wires extending through the apertures and the solder paste, and thereafter bringing the boards carrying the electronic parts optionally with SMD to a specifically designed heating zone where the lower portion of the zone is sufficiently heated to reflow the solder while the upper portion of the zone is gently heated under controlled condition to prevent the electronic parts from any thermal damage.

In accordance with one embodiment of the present invention, therefore, there is provided a method for reflow-soldering of printed circuit boards, which comprises turning upside down print circuit boards the obverse surface of which has one or more electronic parts of a first group mounted thereon by way of soldering which are of relatively high temperature resistance, applying solder paste to penetrated apertures provided on the reverse side of the printed circuit boards, through which lead wires of one or more electronic parts of a second group having relatively low temperature resistance are to be inserted, turning the boards downside up, inserting the lead wires of the electronic parts of the second group into the penetrated apertures or through holes open on the obverse surface of the boards and extending the lead wires through the solder paste on the reverse surface, and thereafter transferring the printed circuit boards to a heating zone involving plural preheating chambers and a reflowing chamber arranged longitudinally in series in such manner that the individual boards are aligned closely without spacing on a conveyer passing through the heating zone and that the upper half portions of the preheating chambers and the reflowing chamber facing the obverse surface of the boards are heated at a temperature lower than the heat-resistance temperature of the electronic parts of the second group while the lower half portions of the preheating chambers and the reflowing chamber facing the reverse surface of the boards are so heated that the temperature in the reflowing chamber is higher than the melting point of the solder paste whereby the solder paste on the reverse surface of each of the boards is molten in the reflowing chamber and solidified after being passed through the heating zone to fix the electronic parts to the boards by soldering.

According to another (second) embodiment of the present invention, there is provided an apparatus for reflow-soldering of printed circuit boards which comprises a heating zone involving plural pairs of preheating chambers and a pair of reflowing chambers respectively located in vertically symmetrical position and arranged in series along the central axis of the heating zone, a conveying means provided with a guide rail or chain forming a loop passing through the heating zone along the central axis thereof and capable of transferring to the heating zone plural printed circuit boards closely aligned in series without spacing thereon, a multi-bladed sirocco fan positioned in the central portion of each pair of the vertically symmetrical preheating and reflowing chambers, a rectifying louver positioned at the exit of hot air flow in each pair of the preheating and reflowing chambers and capable of converting turbulent flow to laminar flow, plural radiant heaters mounted to each pair of the preheating and reflowing chambers in parallel to the moving direction of the print circuit boards, shielding plates provided between the side walls of the preheating and reflowing chambers and the guide rails or chains for shielding them from the radiant heat generated from the heaters, a perforated steel plate provided at the bottom of the upper reflowing chamber for preventing the obverse surface of the printed circuit boards from absorption of the heat, and plural cooling fans provided in the vicinity of the exit of the heating zone for cooling the soldered print circuit boards; the upper preheating and reflowing chambers being maintained at a relatively low temperature with the lower preheating and reflowing chamber being maintained at a relatively high temperature to maintain a difference in temperature between them and the printed circuit boards having electronic parts mounted on the obverse surface thereof by soldering and having temporarily mounted electronic parts of low temperature resistance with lead wires penetrating through apertures open on the obverse surface and through solder paste applied onto the reverse surface of the boards.

In accordance with still another (third) embodiment of the present invention, there is provided a method for reflow-soldering of printed circuit boards, which comprises temporarily mounting electronic parts of a first group on the reverse surface of printed circuit boards after applying solder paste thereonto where necessary, turning the boards downside up, inserting lead wires of electronic parts of a second group having low temperature resistance into apertures open on the obverse surface of the boards and extending the lead wires through the solder paste on the reverse surface, transferring the printed circuit boards thus treated to a heating zone involving plural preheating chambers and a reflowing chamber arranged longitudinally in series in such manner that the individual boards are aligned with little or no spacing therebetween on a conveyer passing through the heating zone and that the upper half of the preheating chambers and the reflowing chamber facing the obverse surface of the boards are heated at a temperature lower than the heat-resistance temperature of the electronic parts of the second group while the lower half of the preheating chambers and the reflowing chamber facing the reverse surface of the boards are so heated that the temperature in the reflowing chamber is higher than the melting point of the solder paste, whereby the solder paste on the reverse surface of the boards is molten in the reflowing chamber and solidified after being passed through the heating zone to fix the electronic parts to the boards by soldering.

In accordance with a further (fourth) embodiment of the present invention, there is provided an apparatus for reflow-soldering of printed circuit boards, which comprises a heating zone involving plural pairs of preheating chambers and a pair of reflowing chambers respectively located in vertically symmetrical position and arranged in series along the central axis of the heating zone, a conveying means provided with guide rails or chains passing through the heating zone along the central axis thereof and capable of transferring to the heating zone plural printed circuit boards aligned in series with little or no spacing therebetween, a fan positioned in the central portion of each pair of the vertically symmetrical preheating and reflowing chambers, a rectifying louver positioned at the exit of hot air flow in each pair of the preheating and reflowing chambers and capable of converting turbulent flow to laminar flow, plural radiant heaters mounted to each pair of the preheating and reflowing chambers, shielding plates provided between the side walls of the preheating and reflowing chambers and the guide rails or chains for shielding them from the radiant heat generated from the heaters, a perforated steel plate provided beneath the rectifying louver of each of the upper preheating and reflowing chambers for preventing the obverse surface of the printed circuit boards from absorption of the heat, an inlet for external air provided at the top of each of the upper preheating and reflowing chambers, a fan coupled to the inlet for forcibly introducing external air through the inlet to prevent ascending of hot air from the lower preheating and reflowing chambers, and plural cooling fans provided in the vicinity of the exit of the heating zone for cooling the soldered printed circuit boards; the upper preheating and reflowing chambers being maintained at a relatively low temperature with the lower preheating and reflowing chambers being maintained at a relatively high temperature to maintain a difference in temperature between them and the printed circuit boards having electronic parts temporarily mounted on the obverse surface thereof and having electronic parts of low temperature resistance with lead wires penetrating through apertures open on the obverse surface and through solder paste applied onto the reverse surface.

BRIEF DESCRIPTION OF THE DRAWINGS

The present invention will become more fully understood from the detailed description given hereinbelow and the accompanying drawings which are given by way of illustration, and thus are not limitative of the present invention, and wherein:

FIGS. 1(a)-1(c) are schematic views of an example of the apparatus in accordance with the second embodiment of the present invention, with FIG. 1(a) being a longitudinal cross section showing the apparatus, FIG. 1(b) being a cross section of the apparatus shown in FIG. 1(a) cut along the line I—I, and FIG. 1(c) being a cross section of the apparatus shown in FIG. 1(a) cut along the line II—II. FIG. 1(d) is a partially enlarged side cross section showing the shielding plate shown in FIG. 1(c).

FIGS. 2(a)-2(c) are perspective views showing the structure of a printed circuit board.

FIGS. 5(a) and 5(b) are schematic diagrams showing an example of a lid plate and the state of printed circuit boards aligned in series on a conveying means.

FIG. 9 is a schematic view of another example of the apparatus in accordance with the fourth embodiment of the present invention.

FIG. 12 is a cross section showing the structure of a transfer chain.

FIG. 14 is a graph showing the relation between the transfer time and the temperature.

DETAILED DESCRIPTION OF THE INVENTION

Figure 3:
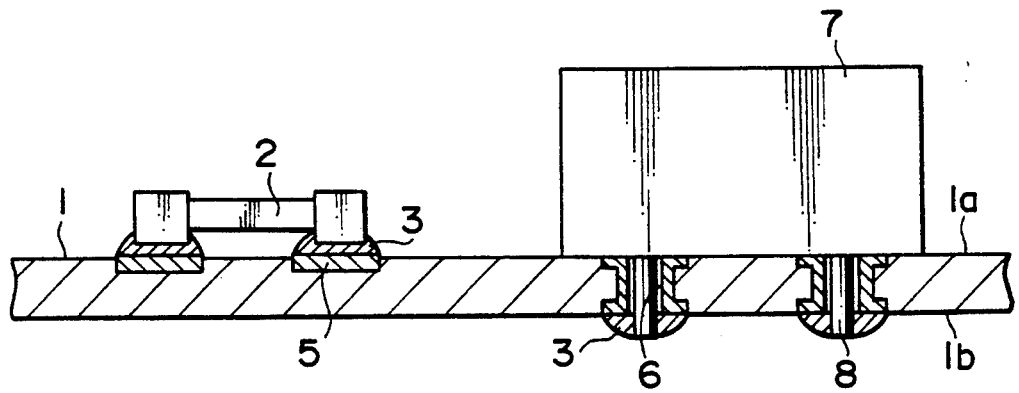
FIG. 3 is a partially enlarged lateral cross section of the printed circuit board shown in FIG. 2(c).

In FIGS. 1(a)-1(c) showing the structure of one example of the apparatus of this invention, the reference numeral 1 is a printed circuit board, 2 a chip part of high temperature resistance, 3 a solder paste, 7 an electronic part with lead wires of relatively low temperature resistance, 8 a lead wire extending through an aperture, 11 a conveyer which, in this example, is a transfer chain, 12 a sprocket, 21 a heating zone of the reflow-soldering apparatus, 22 a first preheating chamber, 23 a second preheating chamber, 24 a reflowing chamber, 25 a heater, 26 a shielding plate, 27 a heating area, 28 a fan, 29 a motor for the fan 28, 30 an exit for hot air, 31 a duct, 32 a rectifying louver, 33 a cooling fan, 34 a ventilating fan, 35 a path of hot air flow, 36 a radiant heater, 37 another shielding plate, and 38 a perforated steel plate.

In FIG. 1(d), showing the structure of an example of the shielding plate, the reference numeral 13 is a holding nail, 14 a guide rail of the transfer chain 11 and 15 a chain cover.

In FIGS. 2(a)-2(c) and FIG. 3, showing the structure of the printed circuit board, the reference numeral 4 is a flat package of high temperature resistance, 5 a printed circuit and 6 a penetrated aperture or through hole formed in the board 1.

Referring to FIGS. 1(a)-1(c), the heating zone 21 is a housing provided with the ventilating fan 34 and openings for entrance and exit of the transfer chain 11 and involving plural (two in this example) preheating chamber 22 and 23 for preliminarily heating the printed circuit boards 1 having an obverse surface 1a and a reverse surface 1b at a temperature lower than the melting point of the solder paste and the reflowing chamber 24 where the temperature is raised higher than the melting point of the solder paste and the soldering treatment is effected. These preheating chamber 22 and 23 and the reflowing chamber 24 respectively have a pair of units which are arranged in vertical symmetry along the transfer chain 11 as a central axis. The upper preheating and reflowing chambers are designated by the reference numerals 22A, 23A and 24A while the lower preheating and reflowing chambers by the reference numerals 22B, 23B and 24B, respectively. The side walls of the preheating chambers 22A and 23A and the reflowing chamber 24A are likewise designated by the reference numerals 22a, 23a and 24a, respectively. The transfer chain 11 is supported by the guide rails 14 covered with the chain cover 15 and allowed to pass through the heating zone 21 along the central axis thereof. The transfer chain 11 is long enough and forms a loop including the portion passing through the heating zone so that it can convey plural printed circuit boards continuously. The transfer chain 11 has several sprockets 12 distributed over the full length thereof and is driven in the direction indicated by the arrow A. The side walls 22a, 23a and 24a are provided with plural heaters 25 arranged in parallel with the moving direction of the printed circuit boards 1 on the transfer chain 11 so that the boards 1 are efficiently heated. Used as the heater 25 is a sheathed heater or any type of heater capable of emitting far infrared rays. The shielding plate 26 is used for shielding the individual chambers 22, 23 and 24 from the radiant heat from the heaters 25 including far infrared rays. The shielding plate 26 also serves to shield the moving printed circuit boards 1 and the chip parts 2 from the heat from the heater 25. Accordingly, the heating area 27 is formed by the shielding plate 26. The fan 28 is installed in the central part of the individual chambers 22, 23 and 24 for circulating the hot air and is driven externally by a motor 29. A multi-blade fan of a large size is particularly useful as the fan 28. The exit 30 is a duct for sending a hot blast for melting the solder paste 3 while another duct 31 functions as an inlet for the hot air formed beneath the heating area 27. The exit 30 of the preheating chambers 22 and 23 and the reflowing chamber 24 is provided with a rectifying louver 32 to convert a turbulent flow formed by the fan 28 to a laminar flow. The printed circuit boards 1 are removed from the heating zone 21, wherein the solder paste is molten, and then cooled by plural cooling fan 33 whereby the molten solder is solidified to fix the electronic parts to the boards. The ventilating fan 34 is usually installed at the top of the heating zone 21, and the path 35 of hot air flow connects the heating area 27 and the fan 28. The heater 36 is provided above the rectifying louver 32 and below the transfer chain 11 to heat the reverse surface 1b of the boards 1. The shielding plate 37 which blocks the space between the chain cover 15 and the side walls 22a, 23a and 24a prevents upward flow of hot air heated in the lower reflowing chamber 24B. The perforated steel plate 38 is provided above the rectifying louver 32 of the reflowing chamber 24 and has a number of small holes and serves to maintain the obverse surface of the printed circuit boards at a lower temperature.

Referring to FIG. 1 (d), showing the details of the shielding plate 37, the printed circuit boards 1 are supported on both side edges by holding pins 13 of the transfer chain 11 which is in turn supported by the guide rail 14, and the space between the guide rail 14 and the side wall 24a of the reflowing chamber 24 is blocked by shielding plate 37 to prevent ascending of hot air heated in the chamber 24B at a higher temperature. This shielding plate 37 also serves to brace the guide rail 14. The chain cover 15 is usually interposed between the guide rail 14 and the shielding plate 37.

FIGS. 2(a)-2(b) show perspective views of the typical printed circuit board 1. In FIG. 2(a), board 1 carries flat packages 4 on the obverse surface 1a which have already been soldered with the solder paste 3 and have high temperature resistance. There are some penetrated apertures 6 and chip part 2 already soldered as well on the obverse surface. FIG. 2(b) shows the reverse surface 1b of the board 1 shown in FIG. 2(a). In this case, only penetrated apertures 6 are open on the reverse surface 1b. FIG. 2(c) shows the result of the present invention; electronic parts 7 with lead wires having low temperature resistance can thus be soldered on the obverse surface 1a without damaging any electronic characteristic property according to the present invention.

FIG. 3 is a partially enlarged cross section of the printed circuit board 1 soldered in accordance with the present invention. The solder paste 3 is first applied to the printed circuit 5 on the obverse surface 1a and is soldered with the chip board 2 of high temperature strength. The printed circuit board 1 is then turned upside down and the solder paste 3 is applied to penetrated aperture 6 open on the reverse surface 1b. The board 1 is turned downside up and the electronic part 7 with lead wires having low temperature resistance is temporarily mounted to the board in such manner that the lead wires 8 are inserted into the penetrated apertures. The board 1 in this state is heated in the heating zone 21 whereby the reverse surface 1b of the board 1 is heated at a temperature above the melting point of the solder paste 3. The board 1 is then cooled by the cooling fan 33 out of the heating zone 21 to solidify the solder 3.

Figure 4A:
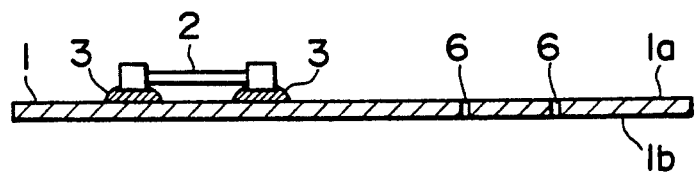
FIGS. 4(a)-4(c) are schematic diagrams showing the process of soldering a printed circuit board.
Figure 4B:
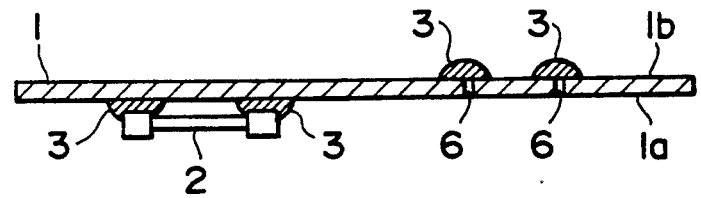
Figure 4C:
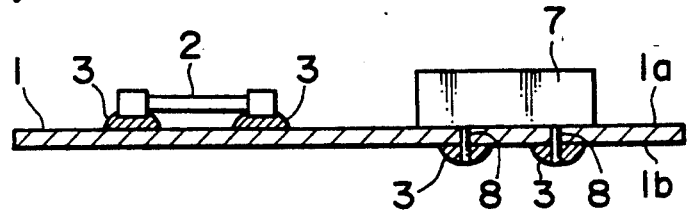

Referring to FIGS. 4(a)-4(c) showing the process of soldering a printed circuit board 1 according to the present invention, the printed circuit board 1 to be treated carries the chip board 2 having been soldered with the solder 3 on the obverse surface 1a. The board 1 has several penetrated apertures 6 open on the obverse surface 1a. In FIG. 4(b), the board 1 is turned upside down and the solder paste 3 is applied, for example, by using an injector (not shown) or by using a screen plate wherein the plate is perforated in the same location as in the boards 1, onto the reverse surface 1b where the apertures 6 exist. The board 1 is then turned downside up as shown in FIG. 4(c). and lead wires 8 of the electronic part having low temperature resistance are inserted into the apertures 6 and extended through the solder paste 3. The board 1 is then passed through the heating zone 21 in this state to complete the soldering treatment.

In the heating zone 21, the board 1 conveyed by the transfer chain 11 as shown in FIG. 1(d) is heated in the preheating chambers 22, 22A, 23 and 23A at a temperature of about 130° C. The solder already applied onto the board 1 is not molten at this temperature. The upper reflowing chamber 24A is maintained at a temperature of about 100° C. while the lower reflowing chamber 24B is heated at about 400° C. by hot air and far infrared rays generated from the radiant heater 36. In this case, the perforated steel plate 38 serves to prevent absorption of far infrared rays in the chamber 24A by the obverse surface 1a of the board 1. Further, ascending of the hot air and radiant heat from the lower reflowing chamber 24B is prevented by the shielding plate 37.

In supplying the printed circuit boards 1 to the heating zone 21, the boards 1 are aligned closely without space on the conveyer 11. If the boards 1 were aligned on the conveyer 11 with space, then the hot air and radiant heat in the reflowing chamber 24B will ascend to the upper reflowing chamber 24 through the space between the boards 1 so that the temperature in the upper reflowing chamber 24A, usually maintained at 100° C. will be elevated to give bad influence on the electronic characteristics of the electronic part 7 of low temperature resistance.

Referring to FIGS. 5(a) and 5(b) showing a plan view and a side view of several lid or cover plates 44, respectively, the conveyer 11 must in general be covered with lid plates 44 without intervening spaces in the event the number of the boards 1 is rather small and some space is formed between them on the conveyer 11. In this case, the size of the lid plate 44 is deemed identical with the printed circuit boards to be conveyed. It is a matter of course that all of the lid plate 44 may be replaced with the printed circuit boards 1 if the number of the boards 1 to be treated is large.

Figure 6:
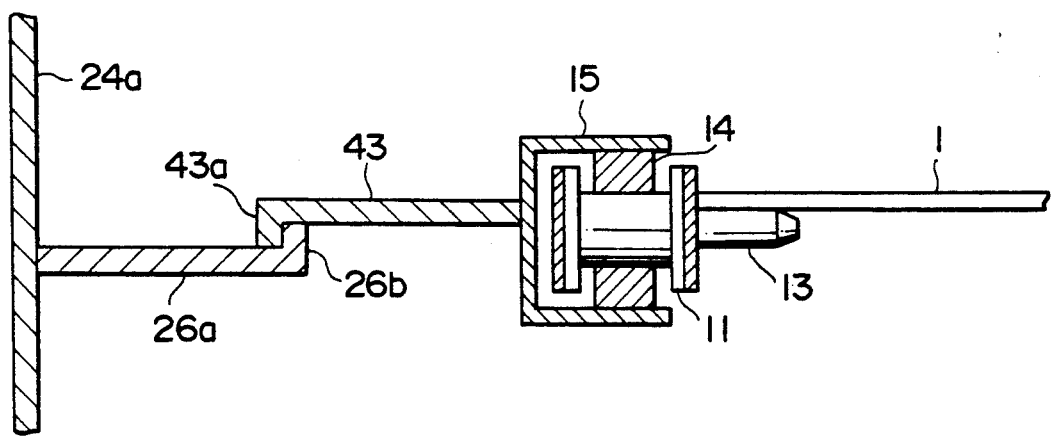
FIG. 6 is a lateral cross section showing the structure of another example of the shielding plate.

In FIG. 6, showing the structure of another example of the shielding plate 37, the reference numerals 1, 11, 13-15 and 24a have the same meanings as given hereinbefore. In this case, the shielding plate 37 in FIG. 1(d) is composed of plates 26a and 43 and joint parts 26b and 43a and is considered as a whole to be a combination of two parts 26a, 26b and 43, 43a both in "letter L" form. As the parts 43a and 43 are slidably adjustable relative to the non-movable parts 26a and 26b, the lateral distance between the side wall 24a and the chain cover 15 can flexibly be changed according to the width of the boards 1 to be treated.

Figure 7A:
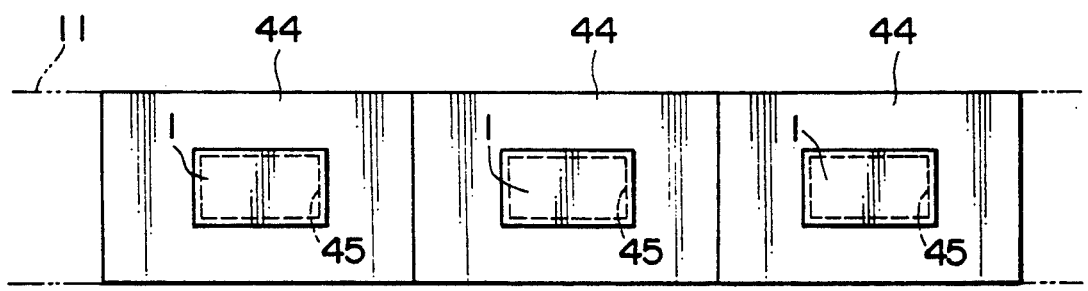
FIGS. 7(a) and 7(b) are a plan view and a longitudinal cross section showing another example of the lid plate.
Figure 7B:
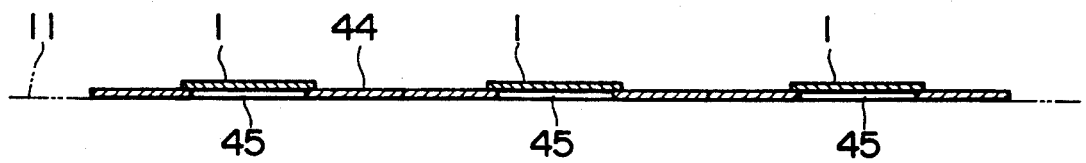

In FIGS. 7(a) and 7(b) showing a plan view and a side view of the structure of another example of the lid plate, respectively, the lid plate 44 has an opening 45 corresponding to the size of a smaller printed circuit board 1. When the size of the board 1 is too small to make adjustment of the shielding plate shown in FIG. 6, the lid plate of this type can effectively be used without any trouble.

Figure 8A:
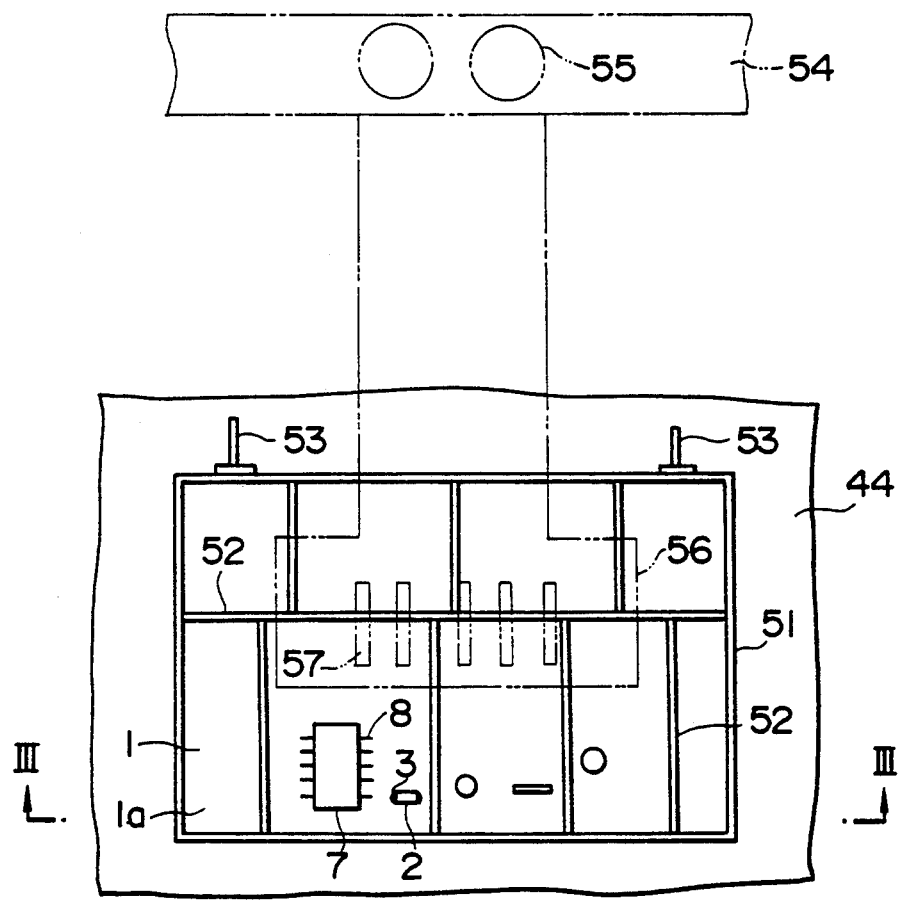
FIGS. 8(a) and 8(b) are schematic diagrams showing the case of using a printed circuit board with chassis, with FIG. 8(a) being a plan view showing a printed circuit board with chassis and FIG. 8(b) being a cross section of the printed circuit board with chassis shown in FIG. 8(a) cut along the line III—III.
Figure 8B:
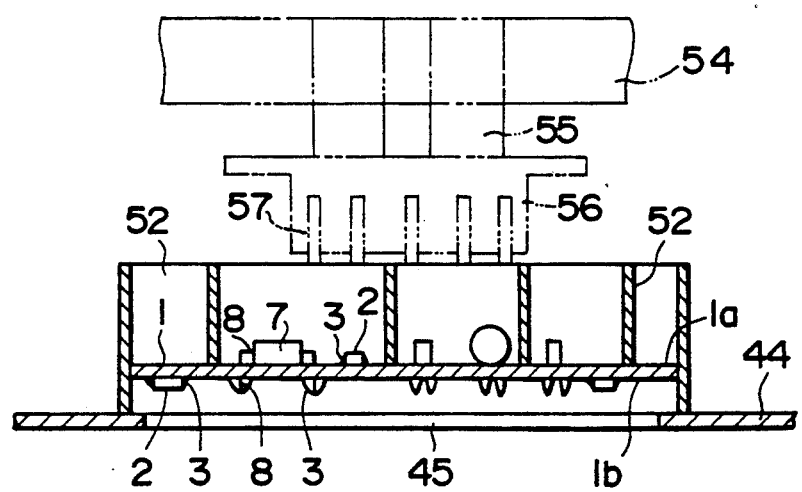

FIGS. 8(a) and 8(b) show the case of the printed circuit board 1 accompanied with a chassis. In these figures, the reference numeral 51 is a chassis of a magnetic substance to which the print circuit board 1 is fixed, 52 a section plate of a magnetic substance formed in the chassis 51, 53 a lead wire projected outwards from the chassis 51, 54 a transfer chain, 55 a rod integrally mounted with the transfer chain 54, 56 a magnetic chuck mounted to the rod 55, and 57 a permanent magnet. The other reference numerals have the same meanings as given hereinbefore. The magnetic chuck 56 is held by the effect that the upper surface of section plate 52 and the chassis 51 are attracted by the permanent magnet 57. The chassis 51 to which the print circuit board 1 is fixed is held by the magnetic chuck 56 and is treated with the reflow-soldering apparatus (not shown) in the same steps as shown in FIGS. 4(a)-4(c) by using the lid plate 44 as shown in FIG. 7 having an opening 45 corresponding to the chassis 51.

FIG. 9 shows the structure of another example of the apparatus in accordance with the third and fourth embodiment of this invention. In this example, the fundamental structure of the heating zone 21 is almost identical with that shown in FIG. 1(a) except that the upper preheating chambers 22A and 23A and the upper reflowing chamber 24A are provided with an inlet 31a for external air and a fan 39 for introduction of external air and that the lower chambers 22B, 23B and 24B are each provided just below the transfer chain 11 with a radiant heater 36a. The reference numeral 42 is an exhaust duct. The difference in technical effect between the apparatus shown in FIG. 9 and the apparatus shown in FIG. 1(a) will become more apparent from the description of the structure and reference to FIG. 10 which is an enlarged drawing of the essential parts shown in FIG. 9.

Figure 10:
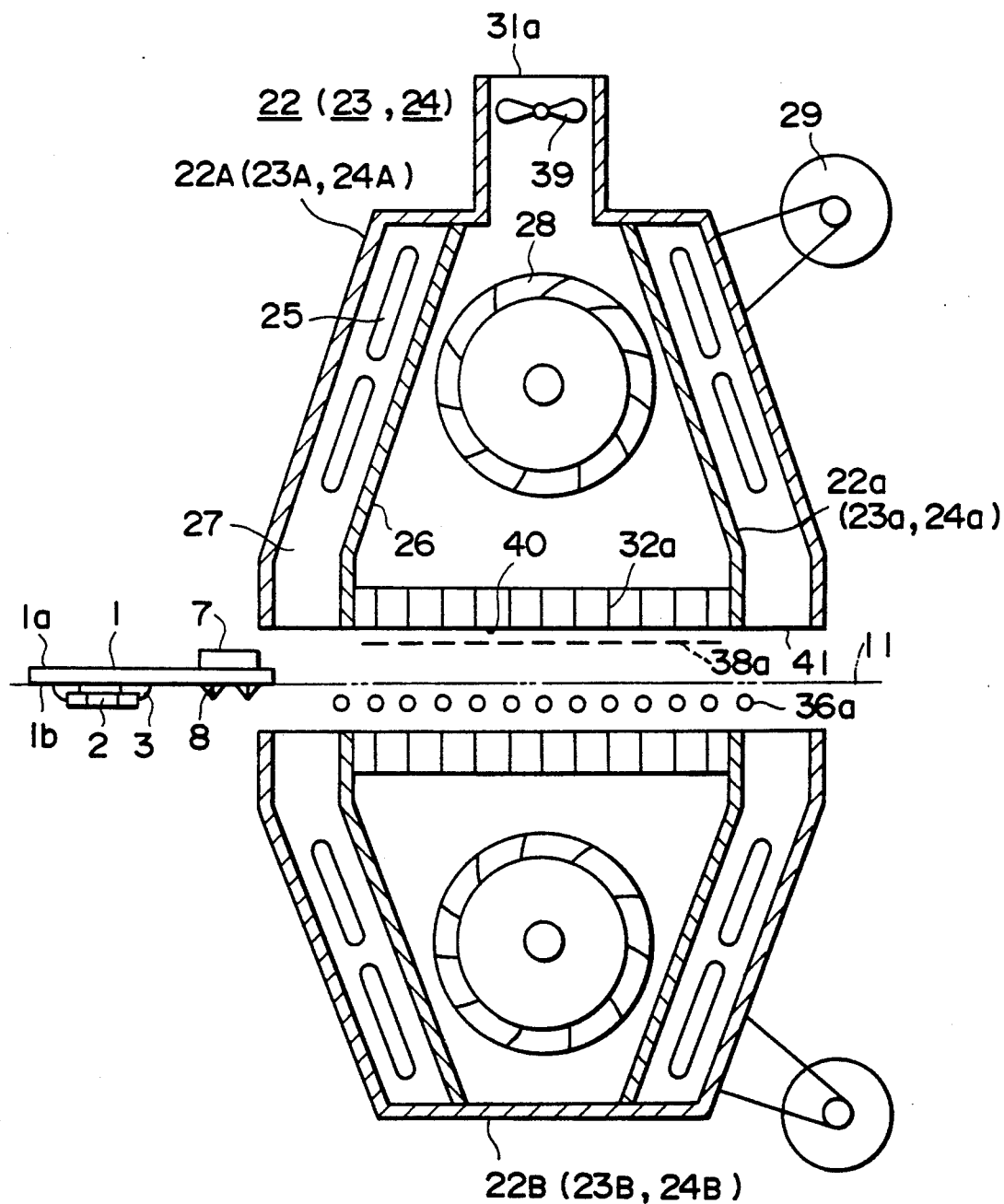
FIG. 10 is a partially enlarged cross section of the preheating or reflowing chamber shown in FIG. 9.

In FIG. 10, showing the structure of the preheating chamber 22 or 23 or the reflowing chamber 24 in detail, the inlet 31a and the fan 39 are used for introducing external air and a duct 40 is used for blowing air to the boards 1. The perforated steel plate 38a is provided below the rectifying louver 32a and the radiant heater 36 is disposed laterally to the moving direction of the boards 1 unlike the case of the apparatus shown in FIG. 1(a). In this apparatus, the upper reflowing chamber 24A is maintained at a temperature below the melting point of the solder paste 3 while the lower reflowing chamber 24B is maintained at a temperature above the melting point of the solder paste. The operation itself for the soldering treatment is carried out in the same manner as described with respect to FIGS. 1(a)-(c).

Figure 11:
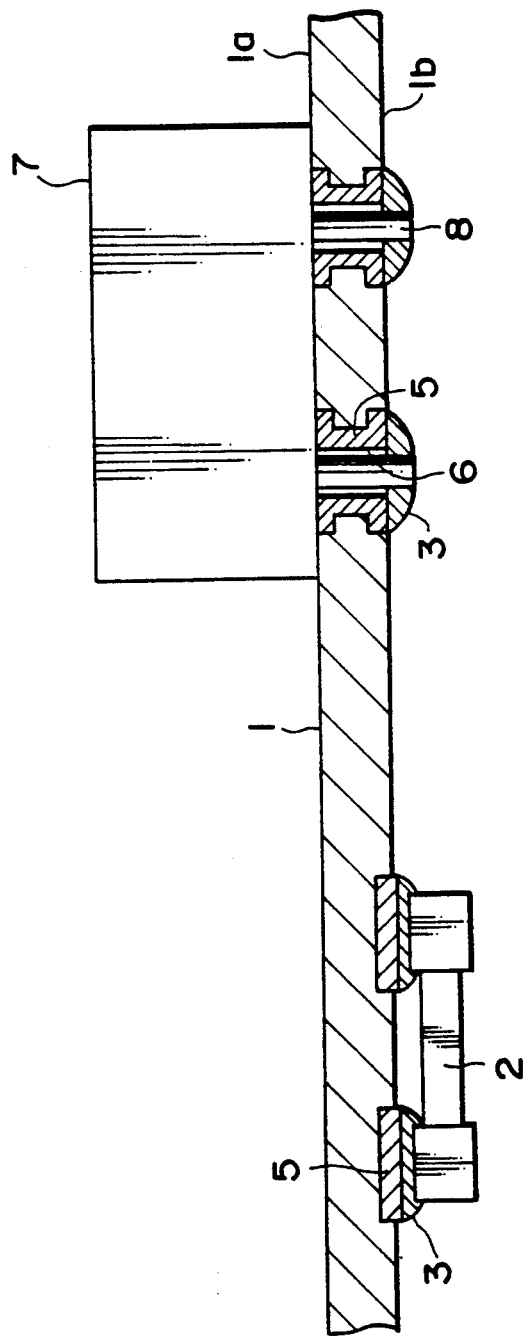
FIG. 11 is an enlarged longitudinal cross section showing the structure of a printed circuit board.

FIG. 11 shows the structure of a printed circuit board in an enlarged scale which has been soldered in accordance with the third and fourth embodiment of this invention using the apparatus shown in FIG. 9. The reference numerals used in FIG. 11 have the same meanings as given hereinbefore.

In FIG. 12, showing the structure of the transfer chain 11, the reference numeral 12a is a holding roll for supporting the print circuit board 1, 15a a chain guide and 26a a shielding plate blocking the space between the side wall 22a (23a or 24a) and the chain guide so that ascending of the hot air flow and radiant heat from the lower chamber 22B (23B or 24B) is prevented.

Figure 13A:
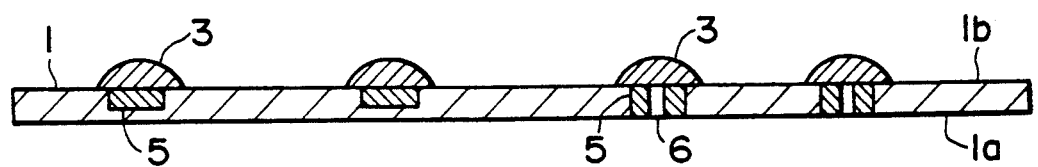
FIGS. 13(a)-13(d) are schematic diagrams showing the process of soldering a printed circuit board.
Figure 13B:
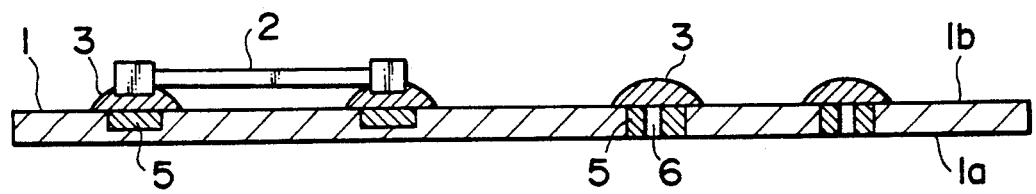
Figure 13C:
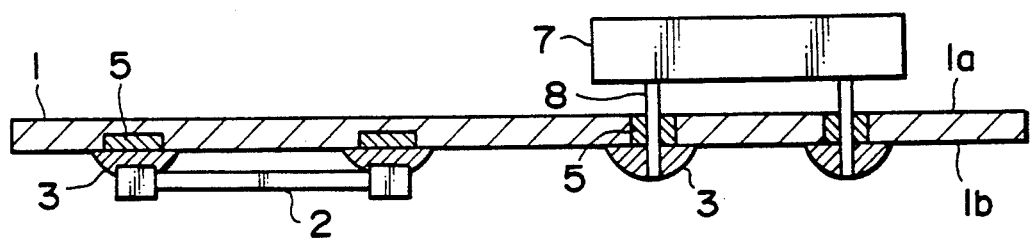
Figure 13D:
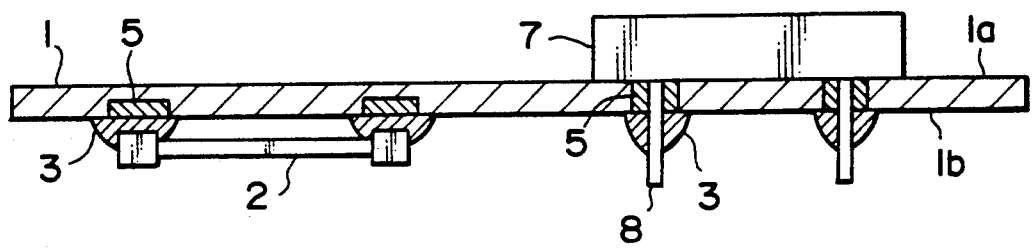

Referring to FIGS. 13(a)-13(d) showing the process of soldering a print circuit board 1 in accordance with the method and apparatus shown in FIG. 9, the printed circuit board 1 is turned upside down and the solder paste 3 is applied onto the penetrated aperture 6 and onto the printed circuit 5 to which the chip part 2 is to be soldered. This state is shown in FIG. 13(a). The application of the solder paste 3 onto the board 1 is carried out by using an injector or a screen plate as in FIG. 4(b). FIG. 13(b) shows temporarily mounting of the chip part 2 on the printed circuit 5. The board 1 is then turned downside up and the lead wires 8 of the electronic part 7 is inserted into the aperture 6 and extended through the solder paste 3 on the reverse surface, as shown in FIG. 13(c). The printed circuit board 1 in this state is placed on the transfer chain 5 and passed through the heating zone 21 whereby reflow-soldering of both of the chip part 2 and the electronic part 7 is simultaneously attained as shown in FIG. 13(d).

In FIG. 14, the broken line stands for the temperature characteristics of the upper chambers 22A, 23A and 24A while the solid line for the temperature characteristics of the lower chamber 22B, 23B and 24B. The printed circuit board 1 is passed through the preheating chamber 22 during the time $t_1$-$t_2$, through the preheating chamber 23 during the time $t_2$-$t_3$ and through the reflowing chamber 24 during the time $t_3$-$t_4$. The time $t_1$ on the abscissa stands for the time of initiation of heating. The room temperature T1 was 20° C. The heating is carried out during the time period of $t_1$-$t_2$, and the external air was introduced from the inlet 31a by the action of the fan 39 into the upper chambers 22A and 23A during the time period of $t_2$-$t_3$ while the temperature was adjusted to T2=90° C. which was lower than the heat resistance temperature of the electronic part 7 to suppress ascending of hot air flow from the lower chambers 22B and 23B. The lower preheating chamber 22B and 23B was heated to T4=150° C. for preheating the board 1. During the time period of $t_3$-$t_4$, the upper reflowing chamber 24A was maintained at the maximum temperature of T3=115° C. while introducing external air from the inlet 31a by driving the fan 39 to suppress ascending of hot air from the lower reflowing chamber 24B. On the other hand, the lower reflowing chamber 24B was heated at about T5=215° C. which is higher than the melting point (180° C.) of solder paste 3 whereby soldering of the chip part 2 and the lead wires 8 of the electronic part 7 was achieved. The printed circuit board 1 was then taken out of the heating zone 21 and cooled by a cooling fan 33 to finish the soldering treatment. The perforated steel plate 38a effectively prevented absorption of far infrared rays from the upper chambers 22A, 23A and 24A by the obverse surface of the board. The air flow through the inlet 31a and the fan 39 prevented intrusion of the hot blast from the lower chambers 22B, 23B and 24B into the upper chambers. In the lower reflowing chamber 24B, the reverse surface of the board was heated by hot blast and far infrared rays generated from the radiant heater 36a. A result of the experiments is plotted in the graph shown in FIG. 14. From the graph, it is understood that the difference in temperature between the lower chambers and the upper chambers is about 100° C.

According to the present invention, it now becomes possible to solder electronic parts of low temperature resistance by means of reflow-soldering. Thus, the washing treatment with freon is utterly unnecessary in the present invention and no problem arises in connection with environmental pollution.

In case of using the apparatus shown in FIG. 9, ascending of the hot blast from the lower reflowing chamber 24B is entirely suppressed by the forced introduction of external air flow through the inlet 31a mounted to each of the upper chambers. Accordingly, it is unnecessary to align the printed circuit boards closely in series without space on the conveyer means. The printed circuit boards can be arranged at any desired intervals on the conveyer means and this serves to simplify the soldering operation. According to this invention, reflow-soldering of printed circuit boards exclusively having electronic parts with lead wires having low temperature resistance can be carried out as well.

What is claimed is:

1. A method for reflow-soldering of printed circuit boards, each of said circuit boards having an obverse surface on which is mounted by soldering one or more electronic parts of a first group having relatively high temperature resistance and a reverse surface having penetrated apertures which extend through said board and open on said obverse surface through which lead wires of one or more electronic parts of a second group having relatively low temperature resistance are to be inserted, said method comprising:

positioning each of said boards to place said reverse surface upwardly and applying solder paste to the penetrated apertures;

turning each of said boards to position said obverse surface upwardly and inserting the lead wires of the electronic parts of the second group into the penetrated apertures open on the obverse surface and extending the lead wires through the solder paste on the reverse surface; and transferring the printed circuit boards to and through a heating zone having plural preheating chambers and a reflowing chamber longitudinally arranged in series in such manner that the individual boards are aligned closely without intervening spaces on a conveyer passing through the heating zone, and wherein the upper portions of the preheating chambers and the reflowing chamber facing the obverse surfaces of the boards are controllably heated to a temperature lower than the heat-resistance temperature of the electronic parts of the second group, while the lower portions of the preheating chambers and the reflowing chamber facing the reverse surfaces of the boards are controllably heated such that the temperature in the lower portion of the reflowing chamber is higher that the melting point of the solder paste, whereby the solder paste on the reverse surface of each board is molten to solder the second group of electronic parts to the board.

2. An apparatus for reflow-soldering of printed circuit boards, each of said circuit boards having an obverse surface on which electronic parts are mounted by soldering and a reverse surface having penetrated apertures which extend through said board and open on said obverse surface, and electronic parts of low temperature resistance temporarily mounted on said obverse surface and having lead wires extending through said apertures and through solder paste applied onto the reverse surface of the board, said apparatus comprising:

a heating zone having plural pairs of preheating chambers and a pair of reflowing chambers respectively located in vertically symmetrical positions and arranged in series along a central axis extending longitudinally of the heating zone;

a conveying means provided with a guide rail or chain forming a loop passing through the heating zone along said central axis and capable of transferring to the heating zone plural printed circuit boards closely aligned in series on said conveying means without spacing between adjacent boards;

a fan positioned in a central portion of each pair of the vertically symmetrical preheating and reflowing chambers;

a rectifying louver positioned at the exit of hot air flow in each pair of the preheating and reflowing chambers and capable of converting turbulent flow to laminar flow;

plural radiant heaters mounted to each pair of the preheating and reflowing chambers, parallel to the moving direction of the printed circuit boards;

shielding plates provided between side walls of the preheating and reflowing chambers and the guide rail or chain for shielding said rail or chain from the radian heat generated by the heaters;

a perforated steel plate provided at the bottom of the upper reflowing chamber for preventing the obverse surface of the printed circuit boards from absorption of the heat; and plural cooling fans provided in the vicinity of the exit of the heating zone for cooling the soldered printed circuit boards, the upper preheating and reflowing chambers being maintained at a relatively low temperature, with the lower preheating and reflowing chambers being maintained at a relatively high temperature to maintain a temperature difference between said upper and said lower preheating and reflowing chambers.

3. A method for reflow-soldering of printed circuit boards, each of said circuit boards having an obverse surface and a reverse surface having penetrated apertures which extend through said board and open on said obverse surface, said method comprising:

temporarily mounting electronic parts of a first group on the reverse surfaces of each of said printed circuit boards after applying solder paste on said reverse surface where necessary;

turning the board to position said obverse surface upwardly and inserting lead wires of electronic parts of a second group having low temperature resistance into said apertures and extending the lead wires through the solder paste on the reverse surface; and transferring the printed circuit boards thus treated to and through a heating zone having plural preheating chambers and reflowing chamber arranged longitudinally in series in such manner that the individual boards are aligned with little or no intervening spacing on a conveyer passing through the heating zone, and wherein the upper portions of the preheating chambers and the reflowing chamber facing the obverse surfaces of the boards are controllably heated to a temperature lower than the heat-resistance temperature of the electronic parts of the second group while the lower portions of the preheating chambers and the reflowing chamber facing the reverse surfaces of the boards are controllably heated such that the temperature in the lower portion of the reflowing chamber is higher that the melting point of the solder paste, whereby the solder paste on the reverse surfaces of the boards is molten in the reflowing chamber and solidified after being passed through the heating zone to fix all electronic parts to the boards by soldering.

4. An apparatus for reflow-soldering of printed circuit boards, each board having an obverse surface and a reverse surface, said apparatus comprising:

a heating zone having plural pairs of preheating chambers and a pair of reflowing chambers respectively located in vertically symmetrical positions and arranged in series along a central axis extending longitudinally of the heating zone;

a conveying means provided with guide rails or chains and passing through the heating zone along the central axis and capable of transferring to and through the heating zone plural printed circuit boards aligned in series on said conveying means with little or no spacing between adjacent boards;

a fan positioned in a central portion of each pair of the vertically symmetrical preheating and reflowing chambers;

a rectifying louver positioned at the exit of hot air flow in each pair of the preheating and reflowing chambers and capable of converting turbulent flow to laminar flow;

plural radiant heaters mounted to each pair of the preheating and reflowing chambers;

shielding plates provided between side walls of the preheating and reflowing chambers and the guide rails or chains for shielding said rails or chains from the radiant heat generated by the heaters;

a perforated steel plate provided beneath the rectifying louver of the upper preheating and reflowing chambers for preventing the obverse surface of the printed circuit boards from absorption of the heat;

an inlet for external air provided at the top of each of the upper preheating and reflowing chambers;

a fan coupled to the inlet for introducing external air through the inlet to prevent ascent of hot air from the lower preheating and reflowing chambers; and plural cooling fans provided in the vicinity of the exit of the heating zone for cooling the soldered printed circuit boards, the upper preheating and reflowing chambers being maintained at a relatively low temperature and the lower preheating and reflowing chambers being maintained at a relatively high temperature to maintain a temperature difference between said upper and lower preheating and reflowing chambers, each of the printed circuit boards having electronic parts temporarily mounted on the obverse surface and having electronic parts of low temperature resistance with lead wires extending through apertures open on the obverse surface and through solder paste applied onto the reverse surface.

5. An apparatus according to claim 2, wherein the shielding plate provided between the side walls of the upper preheating and reflowing chambers and the guide rail or chain is comprised of non-movable parts and slidably movable parts capable of adjusting the distance between said side walls and said guide rail or chain in accordance with the width of the boards.

* * * * *